US011277127B1

(12) United States Patent
Mantooth et al.

(10) Patent No.: US 11,277,127 B1
(45) Date of Patent: Mar. 15, 2022

(54) INTELLIGENT MULTI-LEVEL VOLTAGE GATE DRIVING SYSTEM FOR SEMICONDUCTOR POWER DEVICES

(71) Applicants: H. Alan Mantooth, Fayetteville, AR (US); Shuang Zhao, Gardena, CA (US); Audrey Dearien, Dallas, TX (US)

(72) Inventors: H. Alan Mantooth, Fayetteville, AR (US); Shuang Zhao, Gardena, CA (US); Audrey Dearien, Dallas, TX (US)

( * ) Notice: Subject to any disclaimer, the term of this patent is extended or adjusted under 35 U.S.C. 154(b) by 0 days.

(21) Appl. No.: 16/875,029

(22) Filed: May 15, 2020

Related U.S. Application Data

(60) Provisional application No. 62/848,274, filed on May 15, 2019.

(51) Int. Cl.

| | |
|---|---|
| ***H03K 3/00*** | (2006.01) |
| ***H03K 5/02*** | (2006.01) |
| ***H03K 17/12*** | (2006.01) |
| ***H03K 17/16*** | (2006.01) |
| ***H03K 17/687*** | (2006.01) |
| ***H03K 17/693*** | (2006.01) |
| ***H03K 17/567*** | (2006.01) |
| ***H02M 7/483*** | (2007.01) |
| ***G05F 1/575*** | (2006.01) |
| ***H03K 17/042*** | (2006.01) |

(52) U.S. Cl.

CPC ......... *H03K 17/6871* (2013.01); *G05F 1/575* (2013.01); *H02M 7/483* (2013.01); *H03K 17/04206* (2013.01); *H03K 17/161* (2013.01); *H03K 17/567* (2013.01); *H03K 17/693* (2013.01); *H03K 2217/0036* (2013.01)

(58) Field of Classification Search

None

See application file for complete search history.

(56) References Cited

U.S. PATENT DOCUMENTS

| | | | | |
|---|---|---|---|---|
| 4,424,456 A * | 1/1984 | Shiraki | ................ | G11C 19/285<br>327/108 |
| 6,542,004 B1 * | 4/2003 | Dunne | ................ | H03K 17/163<br>326/112 |

(Continued)

OTHER PUBLICATIONS

B. Whitaker, A. Barkley, Z. Cole, B. Passmore, T. McNutt, and A. Lostetter, "A high-density, high-efficiency, isolated on-board vehicle battery charger utilizing silicon carbide power devices," IEEE Trans. Power Electron., vol. 29, No. 5, pp. 2606-2618, May 2014.

(Continued)

*Primary Examiner* — Kenneth B Wells

(74) *Attorney, Agent, or Firm* — Keisling & Pieper PLC; David B. Pieper; Trent C. Keisling

(57) ABSTRACT

An improved gate driver using a microcontroller (uC), a voltage selector (VS), an adjustable voltage regulator (AVR), and an auxiliary current sinking circuit (ACSC) to actively provide selectable drive signals either higher, lower or equal to the basic on voltage and off voltage drive signals for a selected semiconductor device thereby providing an active voltage-mode gate driver for actively speeding up or slowing both the on time and off time transitions of a semiconductor.

4 Claims, 12 Drawing Sheets

A schematic showing the novel multi-level voltage gate driver.

(56) References Cited

U.S. PATENT DOCUMENTS

| | | | | |
|---|---|---|---|---|
| 7,994,827 | B2 * | 8/2011 | Williams | H03K 17/18 327/110 |
| 9,490,798 | B1 | 11/2016 | Charpentier et al. | |

OTHER PUBLICATIONS

G. Wang, X. Huang, J. Wang, T. Zhao, S. Bhattacharya, and A. Huang, "Comparisons of 6.5kV 25A Si IGBT and 10-kV SiC MOSFET in solid-state transformer application," in Proc. IEEE Energy Conv. Congr. Expo., Atlanta, GA, USA, Sep. 2010.

N. Idir, R. Bausiere, and J. Franchaud, "Active gate voltage Control of turn-on di/dt and turn-off dv/dt in insulated gate transistors," IEEE Trans. Power Electron., vol. 21, No. 4, pp. 849-855, 2006.

R. Howell, S. Buchoff, S. Campen, T. McNutt, A. Ezis, B. Nechay, C. Kirby, M. Sherwin, R. Clarke, and R. Singh, "A 10-kV large-area 4H-SiC power DMOSFET with stable subthreshold behavior independent of temperature," IEEE Trans. Electron Devices , vol. 55, No. 8, pp. 1807-1815, Aug. 2008.

A. Huang, "Medium-voltage solid-state transformer: technology for a smarter and resilient grid," IEEE Ind. Electron. Mag., vol. 10, No. 3, p. 29-42, Sep. 2016.

A. P. Camacho, V. Sala, H. Ghorbani, and J. Martinez, "A novel active gate driver for improving SiC MOSFET switching trajectory," IEEE Trans. Ind. Electron., vol. 64, No. 11, pp. 9032-9042, Nov. 2017.

H. Chen and D. Divan, "High speed switching issues of high power rated silicon-carbide devices and the mitigation methods," in Proc. IEEE Energy Conv. Congr. Expo., Montreal, QC, Canada, 2015.

J. Rice and J. Mookken, "SiC MOSFET gate drive design considerations," in Proc. IEEE Int. Workshop Integrated Power Packaging, Chicago, IL, USA, 2015.

S. Acharya, X. She, F. Tao, T. Frangieh, M. Todorovic, and R. Datta, "Active gate driver for SiC-MOSFET based PV Inverter with enhanced operating range," IEEE Trans. Ind. Appl., 2018.

M. Chen, D. Xu, X. Zhang, N. Zhu, J. Wu, and K. Rajashekara, "An improved IGBT short-circuit protection method with self-adaptive blanking circuit based on VCE measurement," IEEE Trans. Power Electron., vol. 33, No. 7, pp. 6126-6136, Jul. 2018.

Y. Lobsiger and J. W. Kolar, "Closed-Loop di/dt and dv/dt IGBT Gate Driver," IEEE Trans. Power Electron., vol. 30, No. 6, pp. 3402-3417, 2015.

U.S. Pat. No. 9,490,798, issued to Charpentier, et al. on Nov. 8, 2016 entitled Gate drive control system for SiC and IGBT power devices.

A. Charpentier, "Effects of augmented turn-off on Silicon Carbide module performance," AgileSwitch, 2016.

Z. Wang, X. Shi, L. M. Tolbert, F. Wang, and B. J. Blalock, "A di/dt feedback-based active gate driver for smart switching and fast overcurrent protection of IGBT modules," IEEE Trans. Power Electron., vol. 29, No. 7, pp. 3720-3732, Jul. 2014.

Q. Zhou, F. Gao, and T. Jiang, "A gate driver of SiC MOSFET with passive triggered auxiliary transistor in a phase-leg configuration," in Proc. IEEE Energy Conv. Congr. Expo., Montreal, QC, Canada, 2015.

S. Zhao, A. Dearien, Y. Wu, C. Farnell, A. Rashid, F. Luo, and A. Mantooth, "Adaptive Multi-Level Active Gate Drivers for SiC Power Devices," in IEEE Transactions on Power Electronics, vol. 35, No. 2, pp. 1882-1898, Feb. 2020.

H. C. P. Dymond, D. Liu, J. Wang, J. J. O. Dalton and B. H. Stark, "Multi-level active gate driver for SiC MOSFETs," 2017 IEEE Energy Conversion Congress and Exposition (ECCE), Cincinnati, OH, 2017, pp. 5107-5112.

S. Zhao, X. Zhao, A. Dearien, Y. Wu, Y. Zhao and H. A. Mantooth, "An Intelligent Versatile Model-Based Trajectory-Optimized Active Gate Driver for Silicon Carbide Devices," in IEEE Journal of Emerging and Selected Topics in Power Electronics, vol. 8, No. 1, pp. 429-441, Mar. 2020.

S. Zhao, X. Zhao, H. Mehisan, C. Farnell and A. Mantooth, "An Intelligent Model-Based Multi-Level Active Gate Driver for Power Semiconductor Devices," 2019 IEEE Energy Conversion Congress and Exposition (ECCE), Baltimore, MD, USA, 2019, pp. 2394-2400.

* cited by examiner

Fig. 1. A typical converter schematics

Fig. 2. A schematic showing the novel multi-level voltage gate driver.

Fig. 3. The working principle of the auxiliary current sinking circuit

Fig. 4. The switching waveform of the gate driver.

Fig. 5. The flow chart of the optimization algorithm.

Fig. 6 The fast turn-on process of the voltage selector

Fig. 7 The fast turn-off process of the voltage selector

Fig. 8 The slow turn-on process of the voltage selector

Fig. 9 The slow turn-off process of the voltage selector

Fig. 10. The DPT setup schematics.

From Fig. 12, the active gate driver can adjust the $V_{adj2}$, from 3.5 V to 5.5 V. Through changing the intermediate voltage, the slew rate of $V_{ds}$ and $I_{ds}$ can be changed.

The DPT results

INTELLIGENT MULTI-LEVEL VOLTAGE GATE DRIVING SYSTEM FOR SEMICONDUCTOR POWER DEVICES

CROSS-REFERENCE TO RELATED APPLICATIONS

This application claims priority to and is a continuation-in-part of U.S. Patent Application Ser. No. 62/848,274, filed on May 15, 2019 entitled An Intelligent Multi-Level Voltage Gate Driving System for Semiconductor Power Devices which is hereby incorporated by reference in its entirety.

STATEMENT REGARDING FEDERALLY SPONSORED RESEARCH OR DEVELOPMENT

This work is supported by supported by the National Science Foundation Engineering Research Center for Grid-connected Advanced Power Electronic Systems (GRAPES) with cooperative agreement GR-17-04. This invention was made with government support under Grant Number 1747757 awarded by the National Science Foundation. The U.S. government has certain rights in the invention.

REFERENCE TO A MICROFICHE APPENDIX

Not Applicable.

Reservation of Rights

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in driving semiconductor power devices. More particularly, the invention relates to improvements particularly suited for providing a Multi-level adjustable voltage gate driver.

2. Description of the Known Art

As will be appreciated by those skilled in the art, power converters are known in various forms. Literature for consideration includes:

[1] R. Howell, S. Buchoff, S. Campen, T. McNutt, A. Ezis, B. Nechay, C. Kirby, M. Sherwin, R. Clarke, and R. Singh, "A 10-kV large-area 4H-SiC power DMOSFET with stable subthreshold behavior independent of temperature," IEEE Trans. Electron Devices, vol. 55, no. 8, pp. 1807-1815, August 2008.

[2] A. Huang, "Medium-voltage solid-state transformer: technology for a smarter and resilient grid," IEEE Ind. Electron. Mag., vol. 10, no. 3, p. 29-42, September 2016.

[3] B. Whitaker, A. Barkley, Z. Cole, B. Passmore, T. McNutt, and A. Lostetter, "A high-density, high-efficiency, isolated on-board vehicle battery charger utilizing silicon carbide power devices," IEEE Trans. Power Electron., vol. 29, no. 5, pp. 2606-2618, May 2014.

[4] G. Wang, X. Huang, J. Wang, T. Zhao, S. Bhattacharya, and A. Huang, "Comparisons of 6.5 kV 25A Si IGBT and 10-kV SiC MOSFET in solid-state transformer application," in Proc. IEEE Energy Cony. Congr. Expo., Atlanta, Ga., USA, September 2010.

[5] A. P. Camacho, V. Sala, H. Ghorbani, and J. Martinez, "A novel active gate driver for improving SiC MOSFET switching trajectory," IEEE Trans. Ind. Electron., vol. 64, no. 11, pp. 9032-9042, November 2017.

[6] H. Chen and D. Divan, "High speed switching issues of high power rated silicon-carbide devices and the mitigation methods," in Proc. IEEE Energy Cony. Congr. Expo., Montreal, QC, Canada, 2015.

[7] J. Rice and J. Mookken, "SiC MOSFET gate drive design considerations," in Proc. IEEE Int. Workshop Integrated Power Packaging, Chicago, Ill., USA, 2015.

[8] S. Acharya, X. She, F. Tao, T. Frangieh, M. Todorovic, and R. Datta, "Active gate driver for SiC-MOSFET based PV Inverter with enhanced operating range," IEEE Trans. Ind. Appl., 2018.

[9] M. Chen, D. Xu, X. Zhang, N. Zhu, J. Wu, and K. Rajashekara, "An improved IGBT short-circuit protection method with self-adaptive blanking circuit based on VCE measurement," IEEE Trans. Power Electron., vol. 33, no. 7, pp. 6126-6136, July 2018.

[10] Y. Lobsiger and J. W. Kolar, "Closed-Loop di/dt and dv/dt IGBT Gate Driver," IEEE Trans. Power Electron., vol. 30, no. 6, pp. 3402-3417, 2015.

[11] U.S. Pat. No. 9,490,798, issued to Charpentier, et al. on Nov. 8, 2016 entitled Gate drive control system for SiC and IGBT power devices.

[12] A. Charpentier, "Effects of augmented turn-off on Silicon Carbide module performance," AgileSwitch, 2016.

[13] Z. Wang, X. Shi, L. M. Tolbert, F. Wang, and B. J. Blalock, "A di/dt feedback-based active gate driver for smart switching and fast overcurrent protection of IGBT modules," IEEE Trans. Power Electron., vol. 29, no. 7, pp. 3720-3732, July 2014.

[14] N. Idir, R. Bausiere, and J. Franchaud, "Active gate voltage Control of turn-on di/dt and turn-off dv/dt in insulated gate transistors," IEEE Trans. Power Electron., vol. 21, no. 4, pp. 849-855, 2006.

[15] Q. Zhou, F. Gao, and T. Jiang, "A gate driver of SiC MOSFET with passive triggered auxiliary transistor in a phase-leg configuration," in Proc. IEEE Energy Cony. Congr. Expo., Montreal, QC, Canada, 2015.

[16] S. Zhao, A. Dearien, Y. Wu, C. Farnell, A. Rashid, F. Luo, and A. Mantooth, "Adaptive Multi-Level Active Gate Drivers for SiC Power Devices," in IEEE Transactions on Power Electronics, vol. 35, no. 2, pp. 1882-1898, February 2020.

[17] H. C. P. Dymond, D. Liu, J. Wang, J. J. O. Dalton and B. H. Stark, "Multi-level active gate driver for SiC MOSFETs," 2017 IEEE Energy Conversion Congress and Exposition (ECCE), Cincinnati, Ohio, 2017, pp. 5107-5112.

[18] S. Zhao, X. Zhao, A. Dearien, Y. Wu, Y. Zhao and H. A. Mantooth, "An Intelligent Versatile Model-Based Trajectory-Optimized Active Gate Driver for Silicon Carbide Devices," in IEEE Journal of Emerging and Selected Topics in Power Electronics, vol. 8, no. 1, pp. 429-441, March 2020.

[19] S. Zhao, X. Zhao, H. Mehisan, C. Farnell and A. Mantooth, "An Intelligent Model-Based Multi-Level Active Gate Driver for Power Semiconductor Devices,"

2019 IEEE Energy Conversion Congress and Exposition (ECCE), Baltimore, Md., USA, 2019, pp. 2394-2400.

Basic Background

Wide bandgap (WBG) power semiconductor devices, such as silicon carbide (SiC) MOSFETs, show advantage over the silicon (Si) counterparts due to the low conduction losses, switching losses, high operation junction temperature, and the high voltage [1]. Recently, SiC power devices are being developed at high blocking voltages from 10 kV and above which can enable the minimization and simplification of power electronics converters [2].

Due to the intrinsic characteristics of the SiC power devices, they show very high potential to replace application of the Si power devices in the power industry. High operation temperature enables SiC power devices to be more suitable for extreme temperature conditions such as aerospace and automotive. Electric vehicle (EV) applications always call for high power density battery chargers and converters. WBG devices enable EV chargers to be compact and provide a higher-efficiency. The dc/dc converter for a TOYOTA PRIUS (trademark) hybrid vehicle developed by WOLF SPEED (trademark) with SiC power devices was reported in [3]. It increased power density by over 35 times compared with the conventional silicon EV converters.

Another potential application of SiC power devices is the electric power grid. High blocking voltage capability enables SiC perform better than Si power devices in medium-voltage (typically 13.8 kV) applications. The distribution grid is becoming more advanced with the addition of renewable energy resources such as solar and wind power. The development of microgrids utilizing renewable resources can enable the reliability of the grid despite failures. The power electronics can also improve power quality by providing features of voltage regulation, power factor correction, fault current limiting, etc., which is not feasible without power electronics. The conventional medium voltage converter with Si power devices employs modular multilevel converter (MMC) topology which is complex in control and vulnerable due to utilizing a large number of power devices. Emerging high-voltage SiC power devices can effectively reduce the cascaded levels of the power converter. A solid-state transformer (SST) developed with 10 kV SiC power MOSFETs has been reported in [4].

As more nonlinear loads are connected into the power grid, such as electronic devices and motors, power quality problems become more serious. A smart grid can be created and connected with power quality controller devices such as a unified power factor controller (UPFC) or active power filter (APF) as these devices become more accessible. These types of SiC devices are crucial in these applications to enable the power industry to have reliable operation, minimization of system size, and high efficiency.

The performance of the SiC power device depends on the gate driver, which controls its switching performance. SiC MOSFETs in particular provide the benefits of high-voltage blocking, as mentioned before, as well as minimal energy losses because of their ability to switch very fast [3]. The utilization of incumbent gate driver technology is hindering the commercialization of SiC power devices.

The challenge brought by the SiC power devices to gate driver development is principally due to its fast switching characteristics. On one hand, the high switching speed of SiC will help to reduce the switching losses and thus increase the efficiency. Further, fast switching enables size reduction of the converter itself through the minimization of filtering components. However, it also introduces challenges in the form of electromagnetic interference (EMI), crosstalk, and voltage and current overshoot [4]. In other words, when the printed circuit board (PCB) design is poor, the switching speed is preferred to be small. The consequences of fast switching can be the failure of the power device due to a short-circuit event or excessive stress because of operation past the device's maximum ratings, reducing the lifetime of the device and converter. Additionally, other components in the system may be affected by the EMI radiated by the switching of the device. Each of these challenges can be related directly to the device's switching speed, which is the change in its drain-source voltage (dv/dt) and drain current (di/dt) over time. This is even more serious for the high voltage SiC power devices, such as the 10 kV or higher ones. For these devices, the high voltage will generate high dv/dt on the circuit. The common choice to address these issues is using a high gate resistance. However, some references report that the dv/dt is still high when the gate resistance is over 50Ω. A powerful method for flexibly adjusting the switching speed and noise is needed for the commercialization of 10 kV SiC power MOSFETs.

When the PCB design is good enough, the EMI immunity capability is high. Thus, the switching speed can be further increased. Fast switching can reduce the switching power losses.

Other methodologies have been considered to perform the task of reducing slew rates including increasing the gate resistance, using a snubber, and the addition of auxiliary capacitors or inductors [5]-[7]. Although the addition of an external gate resistor can effectively reduce the slew rate, it is not flexible because it must be physically interchanged for tuning, and a single gate resistor value may not have the optimal effect across all conditions. The slew rate of the device is dependent on some other variables, including the load conditions and the temperature. Because tradeoffs must be considered between the slew rate reduction and increased energy losses, this method is not the best to actively optimize the switching performance. The same inflexibility applies to the other methodologies mentioned above, including snubber circuits and added capacitors.

Thus, many active gate driver (AGD) methodologies have also been investigated in the literature to mitigate the challenges associated with the fast switching of SiC MOSFETs. Simply put, an AGD is a kind of gate driver that can control the switching speed of the power devices actively.

Generally, there are three kinds of AGD technologies: variable gate resistance (VGR) method, multi-level driver voltage (MLDV) method, and variable Miller capacitance (VMC) method.

The VGR method is the most commonly used method for the AGD. The prior references [5], [8], and [9] introduce several topologies for the VGR AGD. Compared with MLDV method, the VGR method is easy to design. However, the slew rate control capability of VGR is lower than MLDV. It requires very high gate resistance to suppress the dv/dt to low levels. Also, it requires physical resistors on the board to change the total gate resistance, Rg. To have more adjustable Rg values, a lot of resistors are required and the size of gate driver board will be bulky and full of unwanted parasitics.

The VMC method is another kind of AGD. Through connecting an external Miller capacitor on the power devices, the switching slew rate is changed. This method is reported in [10]. This approach requires an adjustable capacitance which generally introduces high parasitic inductance. Also, the adjustment speed of this method is not fast enough. Another method has been patented in [11]. The method in [11] requires a high-speed voltage regulator and an MCU which is not cost-efficient. Another concern of the method proposed by AGILESWITCH LLC (trademark) is the switching delay. From [12], the profile of the AGILESWITCH LLC (trademark) approach may result in high switching turn-off delay, which will increase the total turn-off duration.

Next, we also note that Active Miller Clamp (AMC) technology is currently available in many gate driver ICs, but may not provide the performance required for SiC MOSFETs [8]. This is due to the placement of the AMC, which must be very close to the SiC MOSFET die to achieve optimal performance to prevent false turn-on, and this is often not possible unless designed into the device package itself. Additionally, the AMC does not prevent EMI issues.

MLDV is commonly used in the desaturation protection of power devices. Through changing the driver voltage during the switching process, the switching slew rate is changed. Several topologies for the MLDV are proposed in [11]-[14]. The gate driver circuitry proposed in [11]-[14] shows good control effect over the EMI noise. However, the intermediate voltage is not adjustable. Moreover, it can only slow down the switching process.

Each of the patents mentioned herein is hereby expressly incorporated by reference in their entirety. From these prior references it may be seen that this prior art is limited in their utilization, and an improved variable-voltage level control allowing decreasing and increasing the speed of transients through the use of intermediate voltage levels between the highest and lowest switching state is needed to overcome these limitations.

SUMMARY OF THE INVENTION

The present invention is directed to an improved gate driver using an adjustable voltage regulator with a current sinking circuit providing power to a voltage selector to provide a gate drive signal. Thus, this invention is a voltage-mode gate driver that implements multi-level voltage control. It consists of a microcontroller (uC), a voltage selector (VS), an adjustable voltage regulator (AVR), and an auxiliary current sinking circuit (ACSC).

The microcontroller (uC) is an ultra-fast processor that receives the PWM signals, bus voltage $V_{BUS}$, and load current $I_O$ feedback from the upper-level main controller. With these signals and the feedback information, the microcontroller will execute an optimization algorithm and control the AVR and VS to generate the optimal driver voltage $V_{dr}$ for the power MOSFET. Since the intermediate voltage is the most important parameter to control the slew rate, it should be a value that will optimize the switching process. This optimization is realized in the microcontroller. It will balance the EMI noise and the power losses. In the optimization algorithm, it is best to avoid using the feedback $V_{ds}$ and $I_{ds}$ since such feedback requires very high bandwidth voltage and current sensors that are very expensive. In its basic form, the algorithm utilizes a mathematical model of the SiC power devices and the model parameters from the datasheet of the SiC power devices. All the effects of these switching performances are evaluated in the cost function, and the algorithm selects the lowest cost value.

The voltage selector (VS) is comprised of three totem-pole gate driver buffers that are connected in cascaded way. Each buffer is easily controlled by the microcontroller and the voltage level at the output can be decided by the designer or based on feedback control to provide the optimal level.

Buffer 1 is the main buffer used to control the turn-on and turn-off of the power devices. In a cascaded fashion, Buffers 2 and 3 are connected to the main buffer, buffer 1, to provide dynamically changing voltage levels. Simply, this driver utilizes three buffers to connect two voltage levels to the pull-up and pull-down terminals of the main driver, being the VCC and VEE of the main buffer, as is the common denotation for gate drive buffers. These buffers work together to enable a final output drive signal with two levels at both turn-on and turn-off. The result of using two voltage levels enables control over the slew rates of the device, whether it is desirable to speed up, or slow down the transition. Speeding up or slowing down the transient is determined by the application and type of SiC power device.

AVR is the digitally controlled voltage regulator. Its output voltage, i.e., Vadj1 or Vadj2 in FIG. 2, is controlled by the microcontroller. The voltage is called the intermediate voltage. This output voltage is the result of the optimization. Through the use of the microcontroller to adjust the voltage levels, the ability to dynamically vary the slew rate of the SiC device is made possible through digital control. This is beneficial due to variations in load conditions, such as the current, which affects the performance of the SiC power device and will change the slew rate. Thus, through feedback control, this gate driver can enable online monitoring of the device and provide control based on the feedback signals. This provides more flexibility compared to the conventional method in which a gate resistor is used to tune the slew rate, which is not dynamically or real-time adjustable. The AVR also has an auxiliary current sinking circuit (ACSC) to help sink the gate current during the turn-off process.

This invention enables the effective use of high-voltage Silicon Carbide (SiC) power MOSFETs. These devices provide various benefits such as high blocking voltages, high temperature operation, high frequency operation and low conduction and switching losses. However, with their fast switching transients produce various challenges that can be detrimental to the device or system. Thus, this active gate driving system is used to provide a great level of control over the slew rates of the device. The voltage level can be optimized by the user to reduce slew rates without increasing the energy losses and the total turn-off duration by an appreciable degree. This implementation in a simple voltage buffer topology also removes the need to physically alter the circuit, such as the gate resistor method. That method is time-consuming and is not able to be controlled live or while online. Or, if a resistor switching matrix is utilized, the parasitics in the gate loop are larger leading to more transient issues and large board area. In contrast, the voltage levels for this invention's driver can be controlled digitally, so that feedback information may be given to the main controller to develop an optimal voltage level and duration for any operating mode.

Advantages of the present invention include:

1—Simple design and control

2—Effective control over the SiC power device switching transitions, lower gate driver losses.

3—Flexibility to be tuned based to the user's needs, i.e. speeding up the transient or slowing down the transient.

4—Intelligent algorithm to optimize the performance of the power devices. The energy losses, duration, and the switching speed are balanced with the algorithm.

5—Easy to develop shoot-through protection. The most commonly used method for shoot-through protection is multi-level turn-off. This circuit is also a multi-level turn-off gate driver. No specific auxiliary circuit is needed to develop protection function.

6—Large range of application occasions. The invention can also be applied to the parallel-connected power devices for balancing the current on each device.

As opposed to conventional methods controlling the switching speed, like using a gate resistor or an additional capacitor, the gate driver signal itself can be used to optimize the switching speed. The gate driver proposed in this invention disclosure has the flexibility to provide slew rate control utilizing a simple topology and control methodology based on the application's requirements. When the EMI immunity is high enough, the patented gate driver can boost the switching speed. For an EMI-vulnerable case, the gate driver can also reduce the switching speed to reduce the EMI current. In other words, this proposed gate driver topology provides a variety of options for adjusting the switching speed and provides optimized waveforms through changing the operation mode. The different operation modes have different current routes and supply voltage.

Although prior art methods do provide control over the slew rate, they do not provide the level of flexibility that the invention described here provides. For example, voltage overshoot is a problem when the device turns off due to high di/dt slew rates and the high dv/dt slew rate will result in higher EMI. Thus, it would be desirable to slow down the switching speed at turn-off. However, to minimize overall power switching loss, which includes both the turn-on and turn-off transient, it may be beneficial to speed up the turn-on transition to compensate for the slow turn-off. While the prior art devices cannot provide this level of control, the driver described in this invention can provide this optimization.

The gate driver described in this invention disclosure can be easily controlled, in the same way that a conventional voltage driver is controlled, and provides many options for tuning and feedback control. This gate driver can provide simple control over the slew rates based on its voltage output, which is easily controlled by a feedback loop based on the load conditions. As the voltage output changes, there is no need for any physical changes to the circuit, as the gate driver itself handles the voltage change. This methodology is proven to be effective to control the slew rate and to find the optimal point that minimizes the switching losses, and still enables high frequency converters (tens to hundreds of kHz).

As more nonlinear loads are connected into the power grid, such as electronic devices and motors, power quality problems become more serious. Power quality controller devices such as the unified power factor controller (UPFC) or active power filter (APF) are becoming more common. SiC devices are crucial in these applications to enable the power industry to have reliable operation, minimization of system size, and high efficiency.

As discussed in the background, the next generation power electronics that enable better performing electric vehicles and power distribution grids can benefit from utilizing high performing SiC power devices. The gate driver enables the slew rate control over dv/dt and di/dt during the turn-on and turn-off transients of a SiC power device to prevent the unwanted consequences of fast switching, including EMI, false trigger, and voltage and current overshoots. The conventional gate driver does not have the capability to dynamically control the switching speed and many of the active drivers proposed in the literature have complicated circuitry and implementation, or do not provide the high level of flexibility required for highly controlled SiC power devices. Thus, the subject gate driver is a type of feedback control.

This gate driver topology is beneficial in any power electronics system that desires to increase power density and improve efficiency through the use of SiC MOSFETs. For example, automotive dc-dc converters or inverters, grid-connected power converters, and motor drives. Therefore, this method may serve:

1. Automotive power electronics
2. Power system applications
3. Defense applications
4. Power inverters
5. Applications in medium and high DC
6. Applications encountering large temperature swings
7. Applications requiring high power density
8. Power converters with n-level switches These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
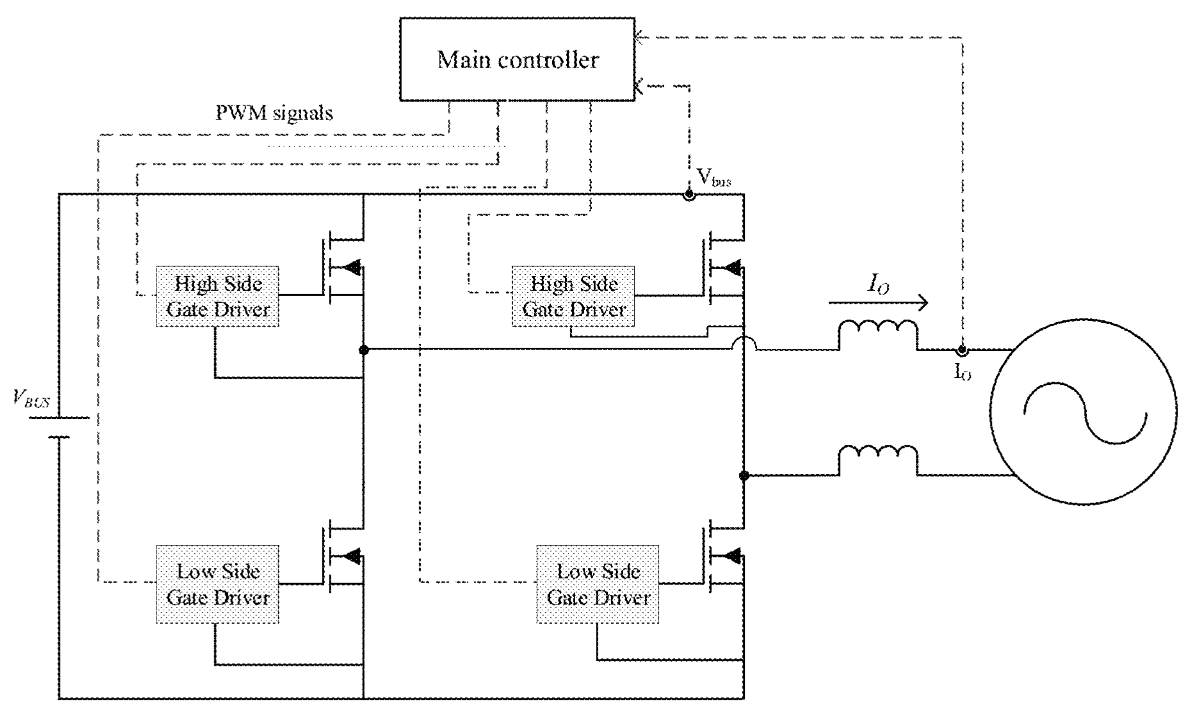
FIG. 1 shows a typical prior art converter schematic.

As shown in FIG. 1 of the drawings, one exemplary embodiment of the present invention is generally shown as a buffered multi-level voltage gate driver 100 to dynamically control the slew rates of SiC power devices, which are known for their high-speed switching transients. These fast transients are beneficial because they enable high-frequency converters and lower switching power losses. However, the fast transients also interact with circuit parasitic inductance and capacitance, resulting in undesirable side effects. Such effects are false turn-on of a device, which could result in a short circuit and device failure. Additionally, voltage overshoot across the device can occur, which may reduce the device's lifetime, and thus result in early failure of a converter or damage surrounding electronics. Electromagnetic interference (EMI) is also a problem due to the fast dv/dt transients. This gate driver solution utilizes a variable voltage level to control the transients, and is implemented in a simple topology that is both convenient and simple to use. The transients can be effectively reduced, or sped up if desired, through the use of an intermediate voltage levels between the highest and lowest switching state.

Figure 2:
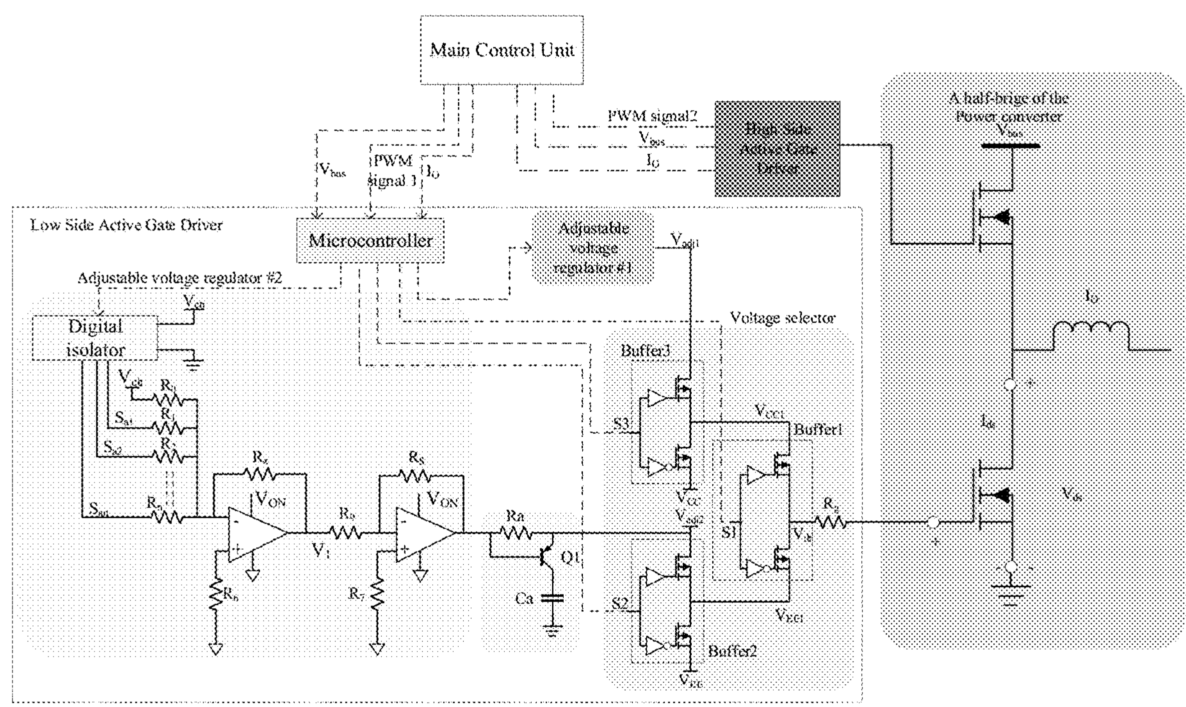
FIG. 2 shows a schematic of the novel multi-level voltage gate driver.

The conceptual schematics of the buffered multi-level voltage gate driver 100 are as shown in FIG. 2. It consists of a microcontroller (uC), a voltage selector (VS), multiple adjustable voltage regulators (AVR), and an auxiliary current sinking circuit (ACSC).

A. The Working Principle of the Adjustable Voltage Regulators

The microcontroller is used to interpret the feedback signals and translate them into physical changes in the driver voltage output. The feedback signals are $V_{BUS}$ and the drain current $I_O$. The microcontroller determines the driver output voltage, $V_{dr}$, based on the feedback signal using a lookup table program. The lookup table is formulated through the testing results of power devices, which may have varying parameters and switching characteristics. Based on the selected $V_{dr}$ and duration, the microcontroller will change the control signal to control the AVR and VS.

The adjustable voltage regulator provides the signal for each $V_{adj}$ signal. Thus, each AVR has a $V_{adj}$ as represented by either $V_{adj1}$ or $V_{adj2}$ as generated by AVR1 and AVR2. Each AVR is an analog adder circuit with an inverted voltage amplifier. The output voltage of the AVR is controlled by adjusting the input resistance connected in parallel. The schematic of the AVR2 is shown in FIG. 2 with AVR 1 having a similar schematic.

For each position of the AVR, $V_{adj}$ is the voltage for the turn-on process or the voltage for the turn-off process, respectively. This output voltage is calculated by:

$$V_{adj} = V_{crt}\left(\frac{1}{R_0} + \frac{S_{a1}}{R_1} + \frac{S_{a2}}{R_2} \ \cdots \ \frac{S_{an}}{R_n}\right) R_X \frac{R_8}{R_9}$$

$S_{a1}$, $S_{a2}$ . . . $S_{an}$ are the control signals from the microcontroller which are either fully high or fully low to control the adjust voltage. $V_{ctr}$ is the output voltage level of the controller.

$V_{ON}$ and $V_{OFF}$ are the high-level and low-level voltages supplied from the isolated power supply which are set to be the normal turn-on voltage and normal turn-off voltage for the power device. These two voltage levels are chosen based on the recommendation on the power device's datasheet.

The microcontroller calculates the current at every switching cycle. The algorithm to determine the $V_{dr}$ profile is based on the $V_{BUS}$ and $I_O$ feedback signal and the model of the power module. Different power modules have different switching characteristics.

Compared with the conventional two-level turn-off waveform, the waveform provided by this gate driver has an additional first level. The conventional two-level turn-off waveform has the disadvantage of a long switching transient due to a long turn-off delay. Since the turn-off delay time does not have high dv/dt or di/dt, a short turn-off delay has no adverse effects, thus a short initial voltage is generated to reduce this delay time, compensating for some of the length due to the increased time during the main switching interval.

B. The Auxiliary Current Sinking Circuit (ACSC)

The ACSC is assisting to sink the gate current when the power device is switching off. It should be noted that the power device can be any type of voltage-driven semiconductor power device, such as a Si or SiC MOSFET or IGBT. To simplify the statement, in the following section, a MOSFET is used as an example.

The ACSC consists of a N-BJT, a capacitor Ca, and a resistor Ra. It is used for preventing false trigger caused by crosstalk noise. This invention utilizes this circuit to assist the AVR to sink gate current. When the power MOSFET is switching off, the gate charge in the junction of the MOSFET will flow back to the AVR. Since the current sinking capability of the Op Amp is low, the ACSC will help the AVR sink some part of gate current and prevent a false trigger.

Figure 3:
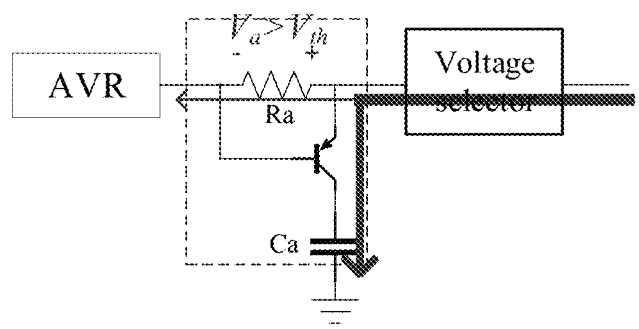
FIG. 3 shows a working principle of the auxiliary current sinking circuit.

The working principle of the ACSC is introduced in detail in FIG. 3. When the gate current is flowing back to the AVR, there will be voltage Va on the resistor Ra. When Va is higher than the threshold voltage of the N-BJT, the BJT will open and some gate current will flow into the capacitor Ca. In this case, the current flowing to the AVR will be reduced and the false trigger probability will decrease.

C. The Working Principle of the Voltage Selector

The VS is also controlled by the microcontroller. Its schematics are also shown in FIG. 2. The multi-level gate driver described in this disclosure consists of three buffers that can be configured in a variety of ways depending on the desired effects on the device, either to speed up or slow down the switching transients, through the control voltages applied at each of the buffers. The three buffers are controlled by the signals from the microcontroller, S1, S2 and S3. The main gate driver buffer, Buffer 1, has the same control signal as the converter. In other words, the signal of Buffer 1 is the same with the PWM signal from the main controller unit of the converter. Buffer 1 provides the final output to the power device. Buffer 3 serves as the turn-on voltage changer which provides two possible voltage levels to the positive pole of the main buffer. Buffer 2 serves as the turn-off voltage changer, providing two possible voltage levels at the turn-off. The output of Buffer 2 is connected to the negative pole of Buffer 1. Since Buffer 3 and Buffer 2 are connected in cascaded way to Buffer 1, the gate driver scheme can be called a cascaded topology.

There are five operation modes for the AGD that can be achieved through the use of this gate driver. Through the combination of different turn-on and turn-off processes, these modes can be generated.

The gate driver operates in five possible modes:

1: Conventional drive (i.e. single turn-on, single turn-off). For this case, no active driving technologies are used. The signals of buffer 2 and buffer 3 are always pulled down to low level.

2: Speed-up mode (i.e. fast turn-on, fast turn-off). It is used for the case when the parasitics on the PCB are very low. The switching of the power device can be sped up to reduce the switching losses and increase the switching frequency of the converter. Also, this mode is suitable for the power MOSFET in some occasions such as the radiative frequency (RF) or high power density converter.

3: Slow-down mode (i.e. slow turn-on, slow turn-off). It is used for the case when the switching frequency is not as significant as the EMI issues, such as the high voltage power device. The power losses are not a main factor in this case. A typical application is the high voltage SiC, typically 10 kV, power devices. Due to the high price and high voltage rating of 10 kV devices, the EMI noise suppression is the priority. In this case, slow-down mode is preferred.

4: Combining mode I (i.e. fast turn-on, slow turn-off). This mode is for some cases when the turn-off EMI and turn-on power losses are too high. In this mode, the turn-on losses are reduced and the turn-off transient are slowed down. This is a commonly used mode for the SiC power devices since the turn-on power losses of the SiC power devices are higher than the turn-off power losses. For the turn-off, the EMI immunity is more significant since the false turn-on and voltage overshoot always happens during the turn-off process. The crosstalk noise caused by hard turn-off is a common cause of a shoot-through event. Therefore, speeding up the turn-on process and slowing down the turn-off process can maximize the benefit and avoid detrimental effects of the SiC power devices under some conditions.

5: Combining mode II (i.e. slow turn-on, fast turn-off). This mode is not commonly used. It can be used in the case when high di/dt and dv/dt transitions are affecting EMI performance. If the turn-on di/dt dominates the detrimental effects of the switching, that will have high EMI immunity pressure for the upper switch. Also, if the dv/dt does not affect the turn-off process significantly, it can be sped up to reduce the turn-off power losses.

The working principle of all modes will be introduced in details as below. Herein, $V_{ON}$ and $V_{OFF}$ are the manufacturer recommended voltage level for normal turn-on and turn-off, respectively. The duration of each stage in the process will be determined by the microcontroller. As introduced in the sections above, the microcontroller selects an optimal intermediate voltage based on the feedback $V_{BUS}$ and $I_O$. If the intermediate voltage level, $V_{BUS}$, and $I_O$ are determined, the duration of each stage of the switching transient process can be calculated with the mathematical model.

Conventional Drive

In this mode, the gate driver will utilize the main voltage supplied by the power supply, $V_{ON}$ and $V_{OFF}$ for turn-on and turn-off, respectively. This is the most common case for a typical gate driver, and will enable the normal switching speed of the device. The switching speed of the power MOSFET will not be controlled by the gate driver. It just depends on the gate resistance.

Fast Turn-on Mode

Figure 6:
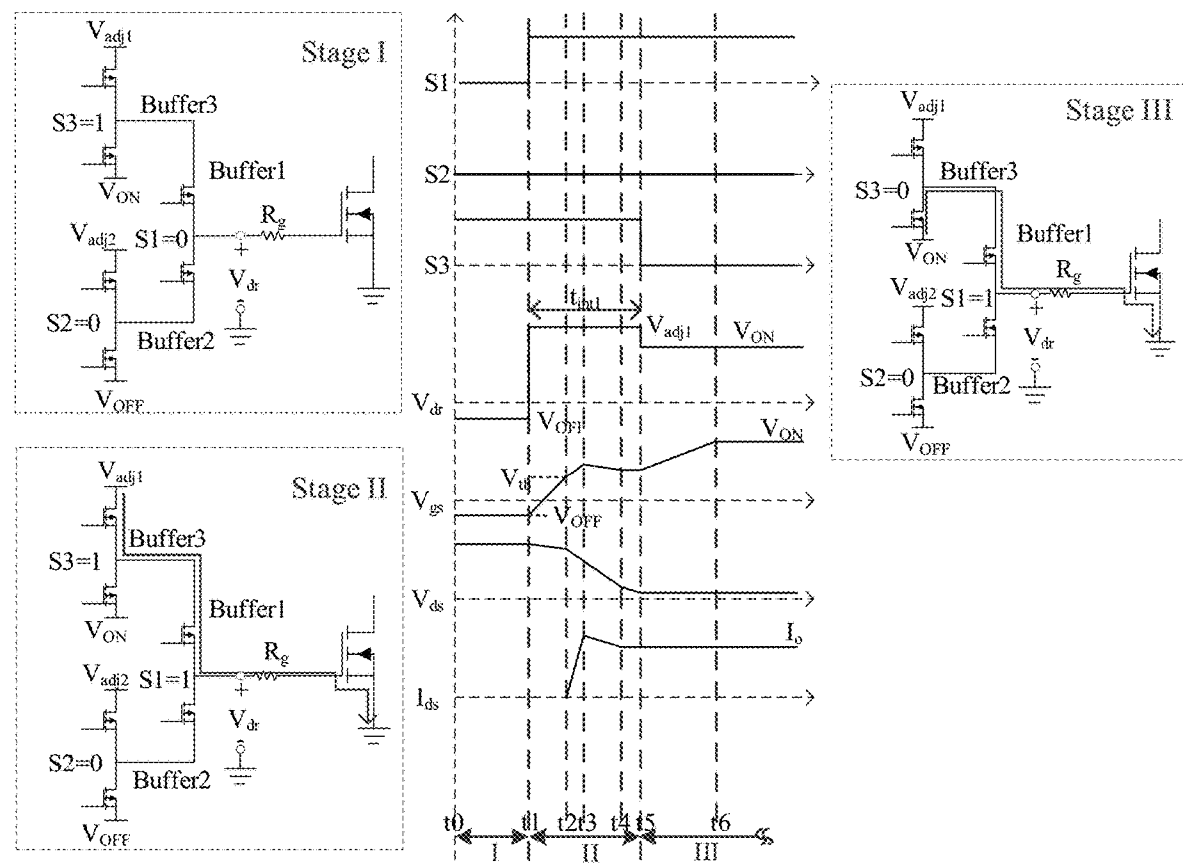
FIG. 6 shows a fast turn-on process of the voltage selector.

In this mode, the gate driver will turn on the power device faster with a higher initial drive voltage. The positive pole of buffer 3 is connected to Vadj1 which is the output voltage of an AVR and negative pole is connected to $V_{ON}$. The transient turn-on voltage $V_{adj1}$ is higher than the normal turn-on voltage. During the turn-on process, buffer 1 is pulled up to select buffer 3. The buffer 3 is also pulled up, and thus $V_{dr}$ is equal to $V_{adj1}$. Since $V_{adj1}>V_{ON}$, the switching process can be accelerated. After the turn-on transient ends, the driver voltage $V_{dr}$ will change back to $V_{ON}$ in order to not overstress the gate connection. The operation of this mode is as shown in FIG. 6.

Fast Turn-Off Mode

Figure 7:
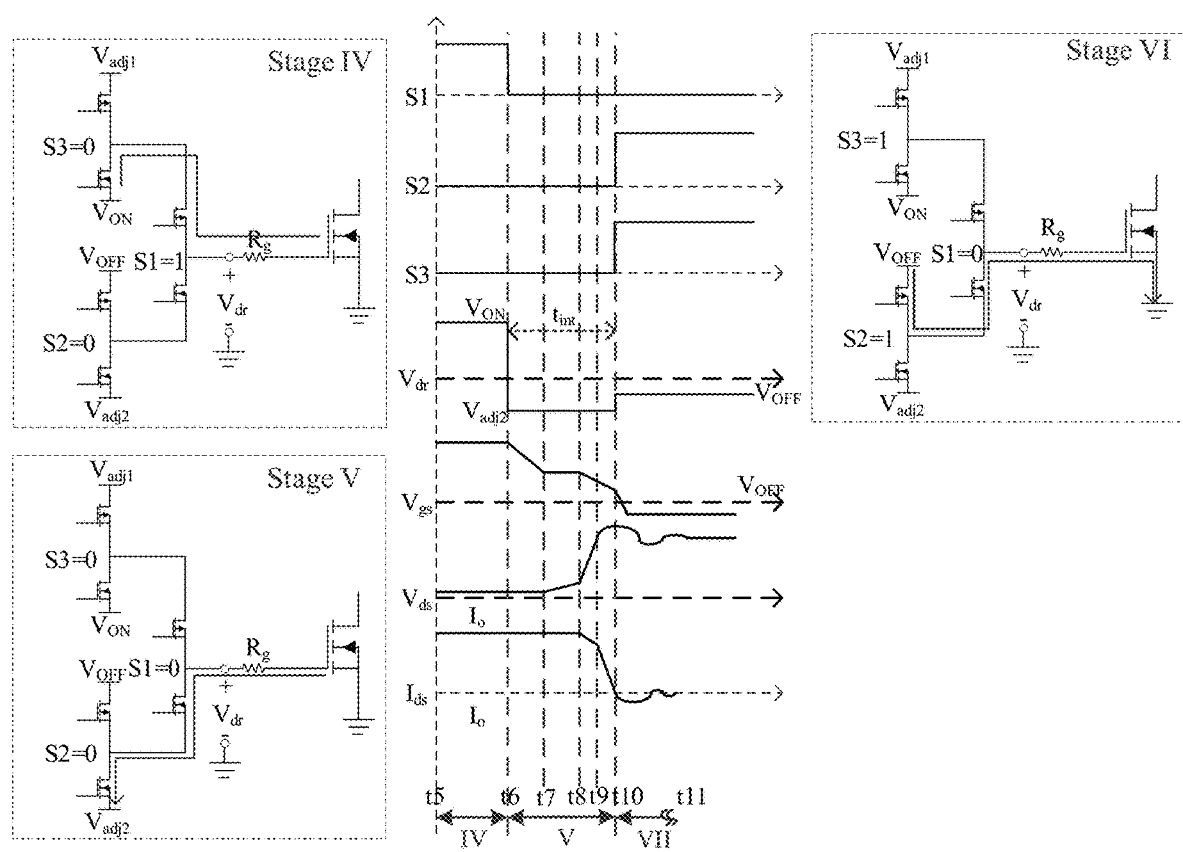
FIG. 7 shows a fast turn-off process of the voltage selector.

In this mode, the gate driver will turn off the power device faster with a lower driving voltage. The negative pole of the Buffer 2 is connected to a lower adjustable voltage Vadj2. The positive pole of the buffer 2 is connected to $V_{OFF}$. It should be noted that $V_{th}<V_{adj2}<V_{OFF}$. After the turn-off transient ends, the driver voltage $V_{dr}$ will change back to normal turn-off voltage. The current route of the fast turn-off mode in the VS is as shown in FIG. 7. When the turn-off PWM signal comes from the microcontroller, Buffer 1 will be pulled down. To speed up the switching process, Buffer 2 will be pulled down and $V_{adj2}$ is connected to the gate of the power device. After the turn-off process ends, Buffer 2 will be pulled up and the normal turn-off voltage $V_{OFF}$ will be connected to the power device. The current flow and the working principle are as plotted in FIG. 7.

Slow Turn-on Mode

Figure 8:
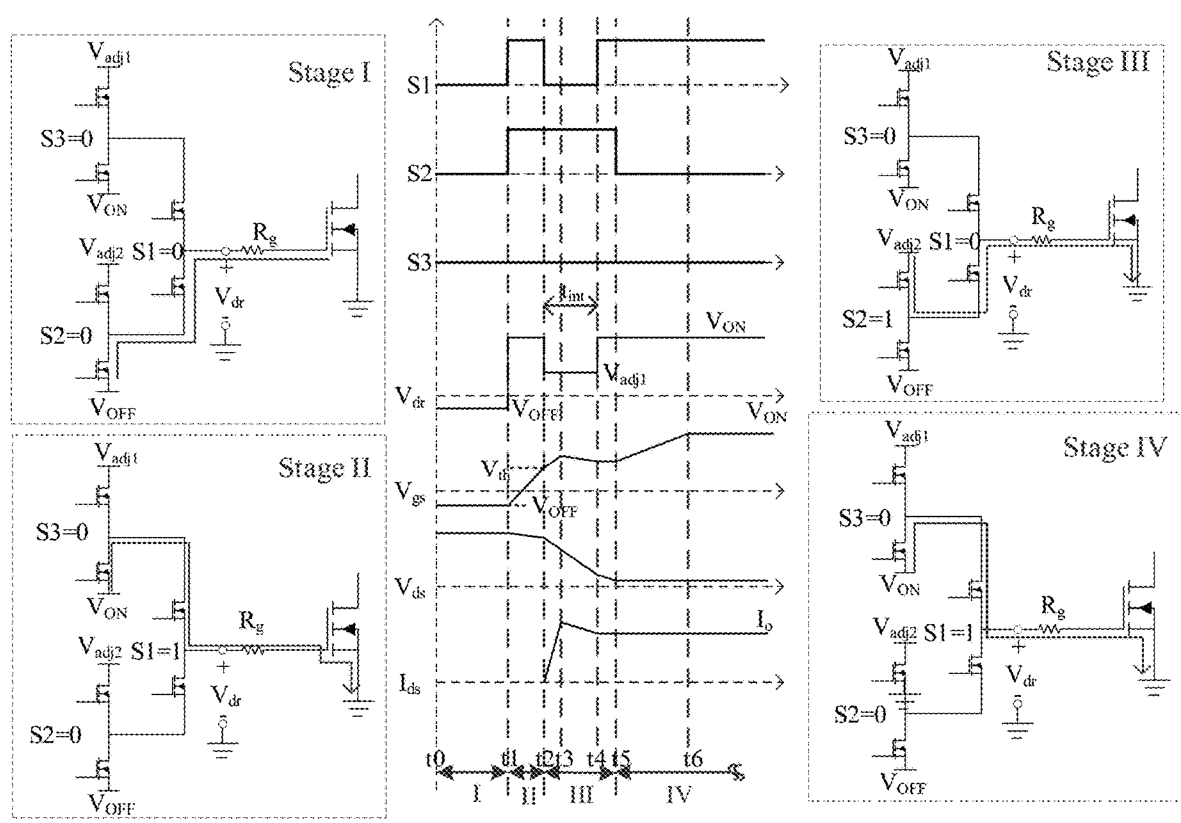
FIG. 8 shows a slow turn-on process of the voltage selector.

In this mode, the gate driver will turn on the power device slower with a lower driving voltage $V_{adj1}$. The positive pole of Buffer 3 is connected to $V_{ON}$ and negative pole is connected to $V_{adj1}$ where $V_{adj1}<V_{ON}$. When the turn-off process comes, Buffer 1 is pulled up to select Buffer 3. Before turning-on, Buffer 3 is high. The gate driver will set to $V_{adj1}$ to reduce the turn-on transient delay. After the turn-on delay, the drain-source current $I_{ds}$ start increasing and the drain-source voltage $V_{ds}$ starts decreasing. To slow down the turn-on dv/dt and di/dt, during the Miller plateau, buffer 3 is pulled down and the $V_{dr}$ changes to $V_{adj1}$. After the drain-source voltage decreases to zero, buffer 3 is pulled up and $V_{dr}$ increases to $V_{ON}$ again. The turn-on voltage will only cover the voltage rising time and the current decreasing time of the power devices. The reason why $V_{dr}$ will change to $V_{ON}$ during the conducting period is due to the conducting resistance. A lower $V_{gs}$ will lead to higher on-resistance and higher conduction power losses. The gate current flow and the working principle are plotted in FIG. 8.

Slow Turn-Off Mode

Figure 9:
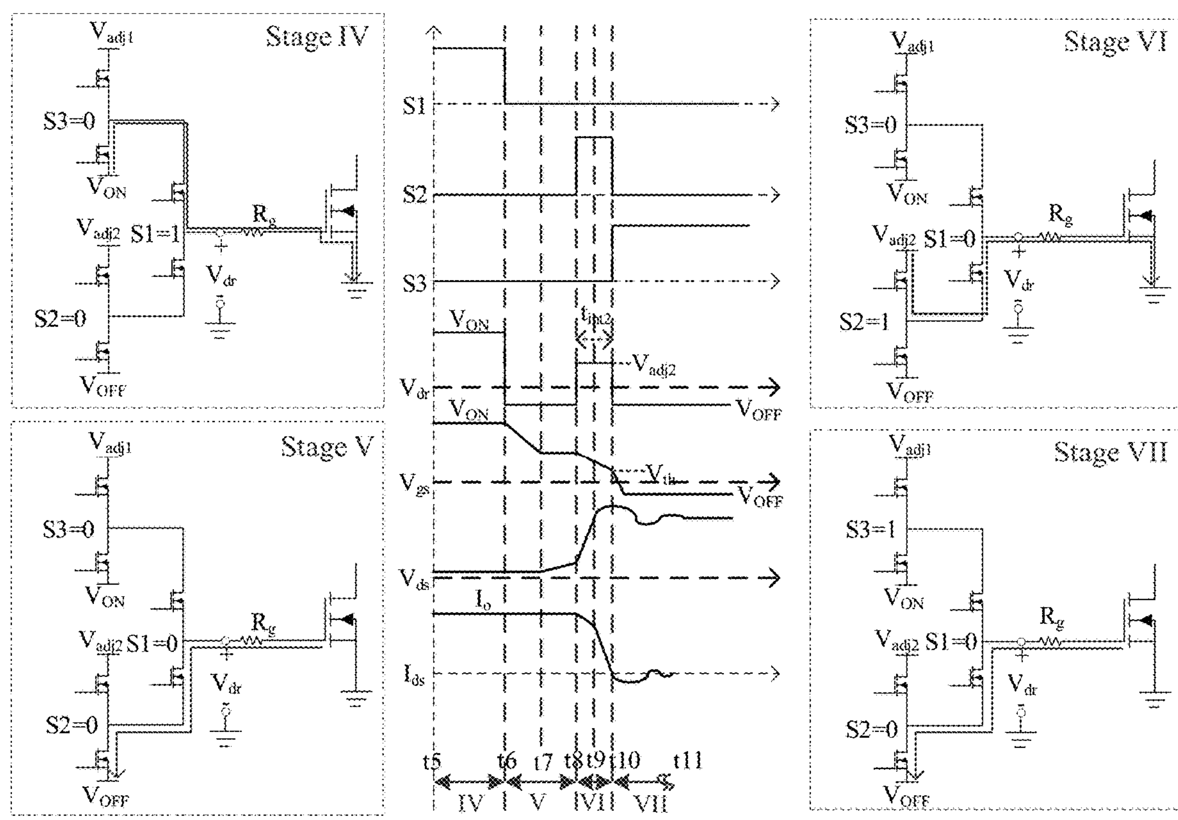
FIG. 9 shows a slow turn-off process of the voltage selector.

In this mode, the gate driver will turn off the power device slower with a lower driving voltage $V_{adj2}$. With a lower level during the Miller plateau period, the dv/dt and di/dt can be reduced. The positive pole of Buffer 2 is connected to a lower voltage, i.e. $V_{adj2}$. The negative pole of Buffer 2 is connected to the normal turn-off voltage $V_{OFF}$ where $V_{adj2}>V_{OFF}$. When the turn-off signal from DSP comes, buffer 1 will be pulled down to select the buffer 2. Buffer 2 is pulled down to output $V_{OFF}$ first. As mentioned before, the initial turn-off voltage is pulled down to $V_{OFF}$ to reduce the turn-off delay before the switching transient happens. After the turn-off delay ends, the buffer 2 will be pulled up and $V_{dr}$ is $V_{adj2}$. Since $V_{adj2}>V_{OFF}$, the dv/dt and di/dt will be lower and the turn-off transient is slowed down. This is beneficial to the EMI immunity and reduction of voltage overshoot. After the $I_{ds}$ decreases to zero and the turn-off transient ends, the buffer 2 will be pulled up again and $V_{dr}$ is $V_{OFF}$ to provide negative clamping voltage for $V_g$s. The process is shown in FIG. 9.

The Optimization Algorithm

The function of the optimization algorithm is to calculate the output voltage profile with the $V_{BUS}$ and $I_O$ feedback. The basic working flow chart is as shown in FIG. 3. The microcontroller receives the $V_{BUS}$ and $I_O$ feedback from the main controller of the converter. With the equation from [16], all the considerations that may affect the switching, such as dv/dt, di/dt, power losses, and total duration, can be quantified.

The total loss function is as shown in Eq. (1).

$$J = \alpha\frac{dv}{dt} \Big/ \frac{dv}{dt}\Big|_{Normal} + \beta\frac{di}{dt} \Big/ \frac{di}{dt}\Big|_{Normal} + \gamma E_{loss} / E_{loss}|_{Normal} \tag{1}$$

In (1), slew rate dv/dt and di/dt and the total turn-off losses $E_{loss}$ can be calculated with [16]. $dv/dt|_{Normal}$, $di/dt|_{Normal}$, and $E_{loss}|_{Normal}$ are the slew rate dv/dt and di/dt and the total turn-off losses under conventional switching conditions. $w_1$, $w_2$, and $w_3$ are the weight coefficients of the several considerations. For different conditions, the selection of the weight coefficients are different. Weight coefficients are determined by the external factors such as parasitics and the thermal management. Generally, low PCB EMI immunity requires high $w_1$, $w_2$. Conversely, poor thermal management should have a higher $w_3$.

If the $V_{BUS}$ and $I_O$ are constant, for a specific power MOSFET, only $V_{adj}$, i.e. $V_{adj1}$ or $V_{adj2}$, affects the output waveform. Therefore, the microcontroller will check with the lookup table for different value of $V_{adj}$ with dv/dt, di/dt, and $E_{loss}$.

Figure 4:
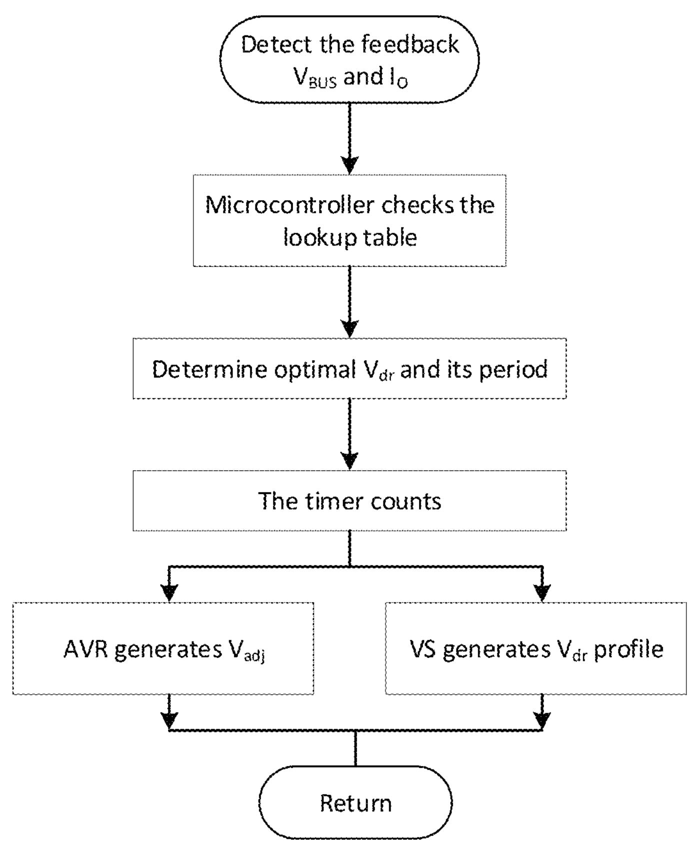
FIG. 4 shows a switching waveform of the gate driver.
Figure 5:
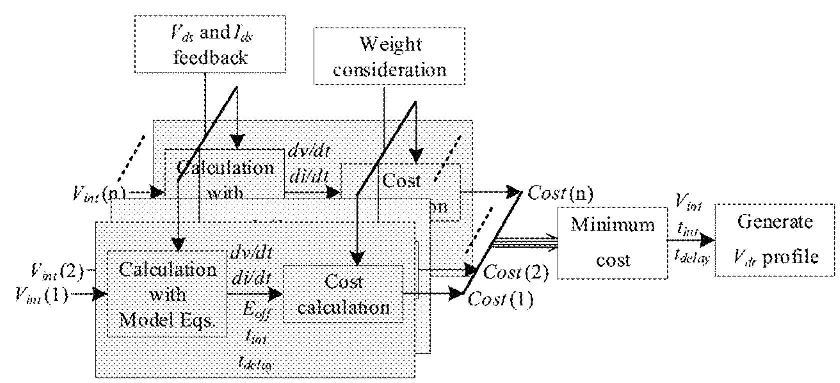
FIG. 5 shows a flow chart of the optimization algorithm.

The process has been explained in FIG. 4. The weight coefficients will be selected first. Then, the microcontroller will read the $V_{BUS}$ and $I_O$ feedback and calculate the parameters. After calculating the results of dv/dt, di/dt, $E_{loss}$, total $V_{adj}$ duration $t_{int}$, and the delay time $t_{delay}$, the parameters will be substituted into Eq. (1) and the total cost will be calculated. Then, the optimal $V_{adj}$ will be selected. Based on the selected $V_{adj}$, the microcontroller will send signals to control the AVR and the VS to generate the right $V_{dr}$ voltage profile.

Example of Operation

Figure 10:
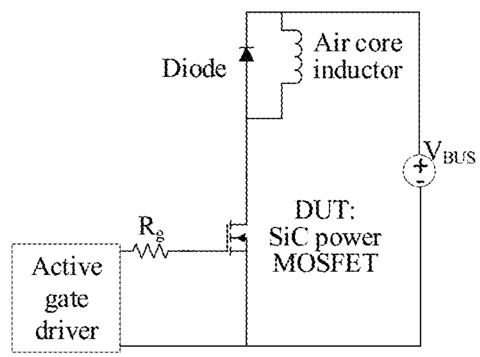
FIG. 10 shows a DPT setup schematic.
Figure 11:
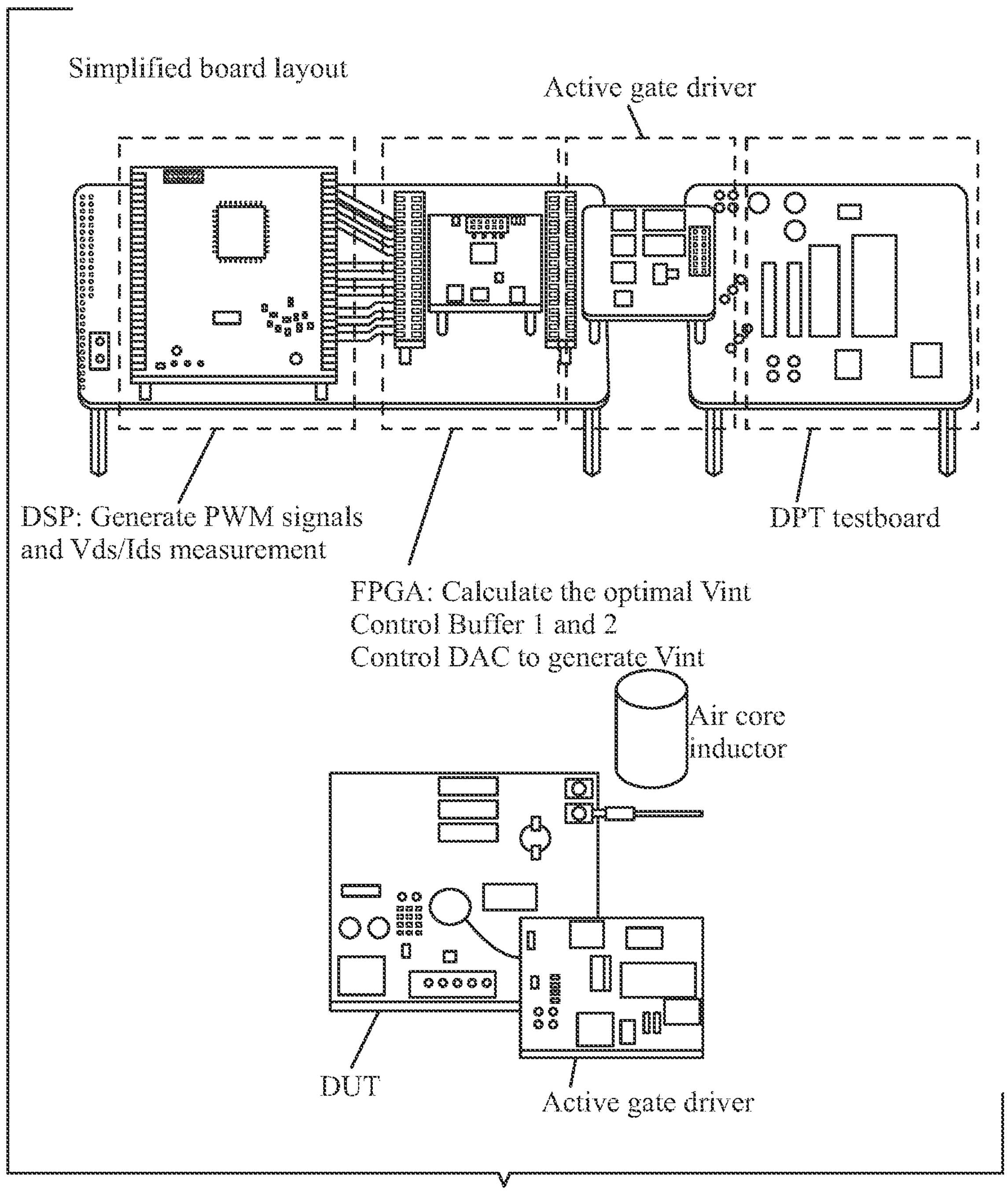
FIG. 11 shows an experimental setup photo.
Figure 12:
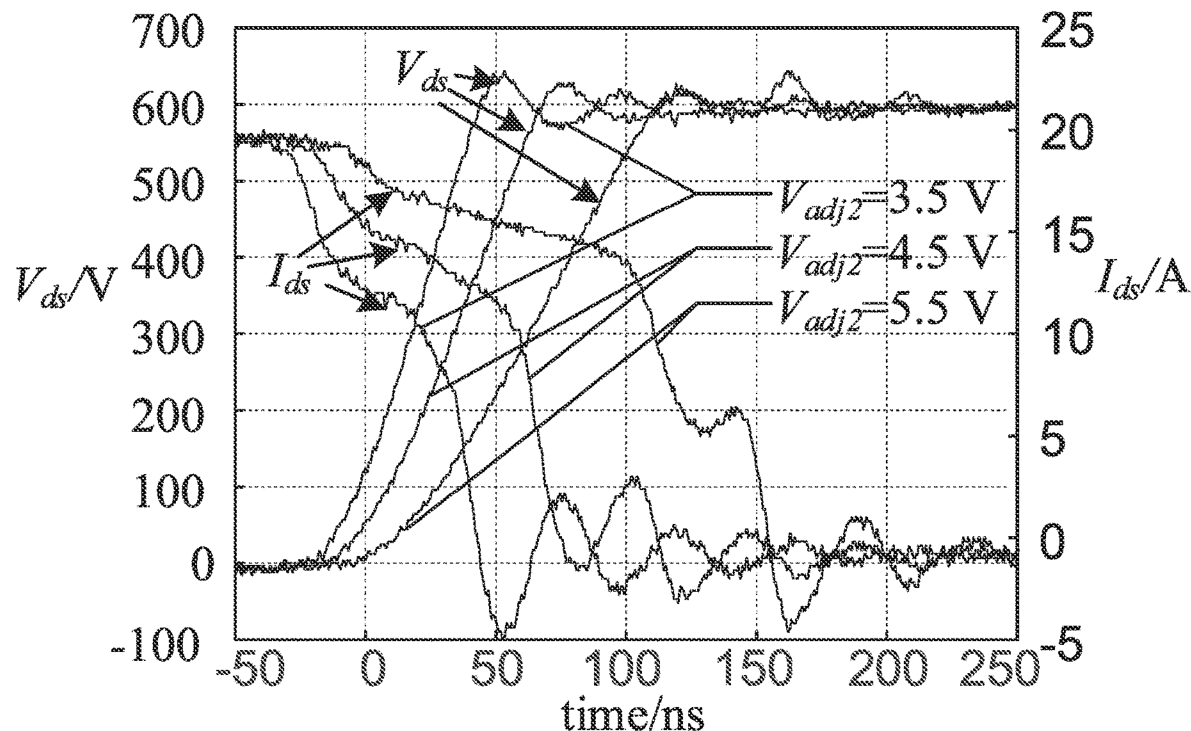
FIG. 12 shows a DPT result where the active gate driver can adjust the $V_{adj2}$, from 3.5 V to 5.5 V to change the slew rate of $V_{ds}$ and $I_{ds}$.

The multi-level turn-off functionality, i.e., slow turn-off function, has been tested and verified to produce desired results. The test is a double pulse test (DPT). The device under test (DUT) is the CREE C2M0045170 SiC power MOSFET. The diode is the Cree C4D30120D. The inductor is an air core type. This methodology has been compared with the conventional method of replacing the gate resistor with a different value. The test circuit schematics are as shown in FIG. 10 and the experiment setup is as shown in FIG. 11 with FIG. 12 showing the DPT results. From FIG. 12, the active gate driver can adjust the Vadj2, from 3.5 V to 5.5 V. Through changing the intermediate voltage, the slew rate of $V_{ds}$ and $I_{ds}$ can be changed.

Reference numerals and nomenclature used throughout the detailed description and the drawings correspond to the following elements:

multi-level voltage gate driver 100
$I_{ds}$ Drain-source voltage of the power device
$I_O$ Load current
$R_g$ Gate resistance of the gate driver
$S_{a1}$-$S_{an}$ Control signals for the AVR
S1-S3 Control signals for Buffer 1-3 respectively
$t_{int}$ Intermediate voltage duration
uC Microcontroller
$V_{adj}$ The output voltage of the AVR. It includes $V_{adj1}$ for turn-on and $V_{adj2}$ for turn-off.
$V_{BUS}$ Bus voltage of the converter
$V_{ctr}$ Power supply voltage for the digital isolator of AVR
$V_{dr}$ Output voltage of the gate driver
$V_{ds}$ Drain-source voltage of power device
$V_{gs}$ Gate-source voltage of power device
$V_{OFF}$ Normal turn-off voltage of power device
$V_{ON}$ Normal turn-off voltage of power device
$V_{th}$ Threshold voltage of power device From the foregoing, it will be seen that this invention is well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. An improved gate driver for power converter using a semiconductor power device controlled by a gate input, the improved gate driver comprising:

a microcontroller, an adjustable voltage regulator connected to the microcontroller;

an auxiliary current sinking circuit connected to the microcontroller;

a voltage selector connected to the microcontroller, the gate input, and the auxiliary current sinking circuit and generating an output signal connected to the gate input;

wherein the microcontroller can actively-vary the output signal for selectively changing both the on time and off time transitions of the semiconductor power device.

2. An improved gate driver for providing a gate signal to a semiconductor device, comprising:

a power supply providing a basic voltage;

an adjustable voltage regulator providing an adjusted voltage different from the basic voltage;

a voltage selector receiving both the basic voltage and the adjusted voltage and selectively applying one of the received voltages as the gate signal; and an auxiliary current sinking circuit electrically connected between the adjusted voltage regulator and the voltage selector.

3. A power converter utilizing a main controller providing a first pulse width modulation signal and a second pulse width modulation signal, a high side semiconductor series connected to a low side semiconductor, the high side semiconductor operated by a high side drive signal, the low side semiconductor operated by a low side drive signal, and a power supply providing a basic on drive voltage and a basic off drive voltage, the power converter comprising:

a high side on adjustable voltage regulator generating an adjusted high side on drive voltage;

a high side off adjustable voltage regulator generating an adjusted high side off drive voltage;

a high side voltage selector receiving the basic on drive voltage, off drive voltage, adjusted high side on drive voltage, and adjusted high side off drive voltage and selectively providing one of the high side received voltages as the high side gate drive signal;

a low side on adjustable voltage regulator generating an adjusted low side on drive voltage;

a low side off adjustable voltage regulator generating an adjusted low side off drive voltage;

a low side voltage selector receiving the basic on drive voltage, off drive voltage adjusted low side on drive voltage, and adjusted low side off drive voltage and selectively providing one of the low side received voltages as the low side gate drive signal.

4. A power converter utilizing a semiconductor device operated by a drive signal and a power supply providing a basic on drive voltage and a basic off drive voltage, the power converter comprising:

an adjustable voltage regulator generating an adjusted-on drive voltage across a voltage extending from above the basic on drive voltage to below the basic on drive voltage; and a voltage selector receiving the basic on drive voltage and adjusted-on drive voltage and selectively providing one of the received voltages as the drive signal.

* * * * *